United States Patent
Mernyk et al.

(10) Patent No.: US 7,180,299 B2
(45) Date of Patent: Feb. 20, 2007

(54) ARC FAULT DETECTOR

(75) Inventors: Ross Mernyk, Brooklyn, NY (US); Roger M. Bradley, North Bellmore, NY (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 0 days.

(21) Appl. No.: 11/292,709

(22) Filed: Dec. 1, 2005

(65) Prior Publication Data

US 2006/0214668 A1    Sep. 28, 2006

Related U.S. Application Data

(63) Continuation-in-part of application No. 10/743,248, filed on Dec. 22, 2003, now Pat. No. 6,972,572.

(51) Int. Cl.
*G01R 31/08* (2006.01)

(52) U.S. Cl. ........................ 324/509; 324/536

(58) Field of Classification Search ............... 324/509, 324/536
See application file for complete search history.

(56) References Cited

U.S. PATENT DOCUMENTS 6,937,027 B2 *    8/2005    Koo et al. ................. 324/536

* cited by examiner

*Primary Examiner*—Vincent Q. Nguyen
(74) *Attorney, Agent, or Firm*—Paul J. Sutton

(57) ABSTRACT

An arc fault detector, as a stand alone device or in combination with a circuit interrupting device such as a ground fault interrupter (GFCI), protects from potentially dangerous arc fault conditions. The device utilizes a line side or load side series connected inductance having an air or magnetic core to generate the derivative di/dt signal of the arc current in the conductor. The derivative signal is fed to an arc fault detector where it is analyzed for the presence of arcing. The device can have a series connected inductor on each of multiple conductors of a power distribution network for phase/neutral or multi-phase arc detection.

17 Claims, 6 Drawing Sheets

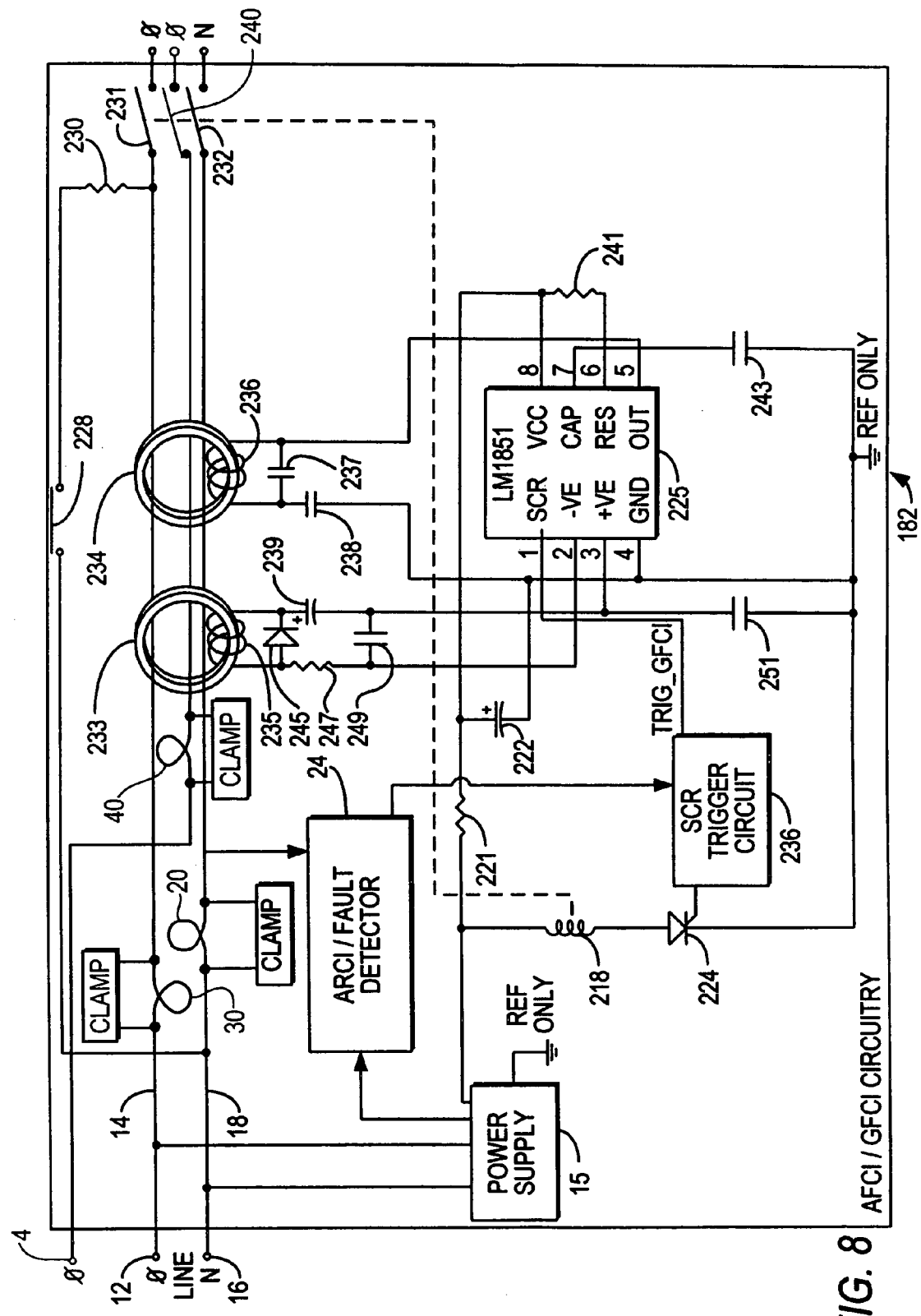
FIG. 8 AFCI/GFCI CIRCUITRY

ARC FAULT DETECTOR

This application is a continuation-in-part and claims the benefit of the filing date of a patent application having Ser. No. 10/743,248, which was filed on Dec. 22, 2003now U.S. Pat. No. 6,972,572.

BACKGROUND OF THE INVENTION

1. Field of the Invention

The present invention relates to an apparatus for arc fault detection and more particularly to both a stand alone arc fault detector and an arc fault detector combined with a circuit interrupter device.

2. Description of Related Art

Circuit breakers, fuses and ground fault circuit interrupters (GFCIs) are commonly used devices for protecting people and property from dangerous electrical faults. Fatalities and loss of property caused by electrical faults that go undetected by these protective devices still occur. One such type of electrical fault that typically goes undetected are arc faults. Arcs are potentially dangerous due to the high temperatures contained within them. Thus, they have a high potential of creating damage, mostly through the initiation of fires. An arc, however, will trip a GFCI only if it produces sufficient current leakage to ground. In addition, an arc will trip a breaker only if the current flowing through the arc exceeds the trip parameters of the thermal/magnetic mechanism of the breaker. Therefore, an additional type of protection device is needed to detect and interrupt arcs. An arc detector whose output is used to trigger a circuit interrupting mechanism is referred to as an Arc Fault Circuit Interrupter (AFCI).

The causes of arcing are numerous, for example: aged or worn insulation and wiring; mechanical and electrical stress caused by overuse, over currents or lightning strikes; loose connections; and mechanical damage to insulation and wires. Two types of arcing can occur in residential and commercial buildings: contact arcing and line arcing. Contact or series arcing occurs between two contacts in series with a load. Therefore, the load controls the current flowing in the arc. Line or parallel arcing occurs between the conductors of a circuit or from a conductor to ground. In this case the arc is in parallel with any load present and the source impedance provides the only limit to the current flowing in the arc.

An example of contact arcing is illustrated in FIG. 1. The conductors 114, 116 comprising the cable 110, are separated and surrounded by an insulator 112. A portion of the conductor 114 is broken, creating a series gap 118 in conductor 114. Under certain conditions, arcing will occur across this gap, producing a large amount of localized heat. The heat generated by the arcing might be sufficient to break down and carbonize the insulation close to the arc 119. If the arc is allowed to continue, enough heat will be generated to start a fire.

A schematic diagram illustrating an example of line arcing is shown in FIG. 2. Cable 120 comprises electrical conductors 124, 126 covered by outer insulation 122 and separated by inner insulation 128. Deterioration or damage to the inner insulation at 121 may cause line fault arcing 123 to occur between the two conductors 124, 126. The inner insulation could have been carbonized by an earlier lightning strike to the wiring system, or it could have been cut by mechanical action such as a metal chair leg cutting into an extension cord.

The potentially devastating results of arcing are widely known and a number of methods of detecting arcs have been developed in the prior art. A large percentage of the prior art refers to detecting high frequency signals generated on the AC line by arcs.

A wide range of prior art exists in the field of arc detection. Some of the prior art refer to specialized instances of arcing. For example, U.S. Pat. No. 4,376,243, issued to Renn, et al., teaches a device that operates with DC current. U.S. Pat. No. 4,658,322, issued to Rivera, teaches a device that detects arcing within an enclosed unit of electrical equipment. U.S. Pat. No. 4,878,144, issued to Nebon, teaches a device that detects the light produced by an arc between the contacts of a circuit breaker.

In addition, there are several patents that refer to detecting arcs on AC power lines that disclose various methods of detecting high frequency arcing signals. For example, U.S. Pat. Nos. 5,185,684 and 5,206,596, both issued to Beihoff et al., employ a complex detection means that separately detects the electric field and the magnetic field produced around a wire. U.S. Pat. No. 5,590,012, issued to Dollar, teaches measuring the high frequency current in a shunted path around an inductor placed in the line, which can be the magnetic trip mechanism of a breaker. In a second detection circuit, proposed by Dollar, high frequency voltage signal is extracted from the line via a high pass filter placed in parallel with a load.

Various methods can be found in the prior art to authenticate arcing and to differentiate arcing from other sources of noise. Much of the prior art involves complicated signal processing and analysis. U.S. Pat. No. 5,280,404, issued to Ragsdale, teaches looking for series arcing by converting the arcing signals to pulses and counting the pulses.

In addition, several patents detect arcing by taking the first derivative or second derivative of the detected signal. For example, U.S. Pat. No. 5,224,006, issued to MacKenzie et al., and U.S. Pat. Nos. 5,185,684 and 5,206,596, issued to Beihoffet al, disclose such a device.

Blades uses several methods to detect arcs as disclosed in U.S. Pat. Nos. 5,223,795, 5,432,455 and 5,434,509. The Blades device is based on the fact that detected high frequency noise must include gaps at each zero crossing, i.e., half cycle, of the AC line. To differentiate arcing from other sources of noise, the Blades device measures the randomness and/or wide bandwidth characteristics of the detected high frequency signal. The device taught by U.S. Pat. No. 5,434,509 uses the fast rising edges of arc signals as a detection criterion and detects the short high frequency bursts associated with intermittent arcs.

U.S. Pat. No. 5,561,505, issued to Zuercher et al., discloses a method of detecting arcing by sensing cycle to cycle changes in the AC line current. Differences in samples taken at the same point in the AC cycle are then processed to determine whether arcing is occurring.

A characteristic of arcing on a conductor is the occurrence of high frequency signals which are different from the frequency (normally 60 cycles) of the current for which the conductor is intended to carry. Electrical arcing produced by alternating voltage will extinguish each time the voltage across the arc drops below a value sufficient to sustain the arc, and will re-ignite each time the voltage across the arc exceeds the arc's minimum ignition voltage. The ignition voltage is substantially proportional to the size of the physical gap that the arc must traverse.

The extinction voltage tends to be lower than the ignition voltage. When the arc gap is very large, the arc will be intermittent and unstable and will tend to extinguish itself and re-ignite as conditions permit. As the gap becomes smaller, the arc becomes more persistent and eventually self-sustaining. When the gap becomes much smaller, the arc tends to self-extinguish by completing the current path. When the arc conducts occurs, high frequency signals are produced on the electrical conductors.

A number of systems that have been developed to detect arcing in buildings do so by monitoring high frequency signals present on the conductors. One such method of detecting arcing is by an arc detector that detects the derivative of the signal on the conductor. Typically, such arc detectors employ, for example, current transformers to produce signals representative of the high frequency signals on the wiring being monitored. Current transformers both add to the manufacturing cost of the arc fault detector and, because of the size of the components, creates packaging difficulties. In addition, current transformers have a limited high frequency response and poor signal-to-noise ratio.

Accordingly, there is a need for an arc fault detector that provides improved signal to noise ratio, improve high frequency response, that is relatively economical to build and that is relatively small in size.

SUMMARY OF THE INVENTION

The arc fault detector of the present invention can operate either as a stand alone Arc Fault Circuit Interrupter (AFCI) or in combination with a Ground Fault Circuit Interrupter (GFCI) to interrupt the flow of current to a load when an arc is detected. The combination device, known as an arc fault circuit interrupter/ground fault circuit interrupter (AFCI/GFCI), can be realized by the addition of arc detection circuitry to a standard GFCI. An AFCI/GFCI device is a combination arc fault and ground fault detector, which has the ability to interrupt a circuit and thereby prevent both dangerous arcing and ground fault conditions from harming personnel or property. The term 'circuit interrupting device' is defined to mean any electrical device used to interrupt current flow to a load and includes, but is not limited to devices such as Ground Fault Circuit Interrupters (GFCIs), Immersion Detection Circuit Interrupters (IDCIs) or Appliance Leakage Circuit Interrupters (ALCIs).

In the arc detector here disclosed, an inductor connected in series with at least the phase or neutral conductor monitors the current in the at least one conductor to detect arcing such as line-to-line, line-to ground, line-to-neutral or contact arcing. The signal from the inductor is the derivative(di/dt) of the current monitored and is fed to arc detection circuitry which comprises a peak detector with decay, a microcontroller, and a circuit interrupter. The series inductor can vary from a wire having a partial loop or bend to 100 or more full loops and a core that is either of air or a magnetic material for generating the derivative signal, the di/dt signal, of the current flowing through the conductor.

The present invention is capable of detecting arc faults on the line and/or load sides of the device. Once processed, the peak amplitudes of the sensed di/dt signals are directed to a microcontroller which analyzes the signal for the presence of arcing characteristics. Upon identifying a signal which indicates that arcing is present in a conductor, a trip signal is generated and fed to an interrupting mechanism which interrupts the flow of electricity to the load.

The circuit for the microcontroller can be placed on its own chip or on the chip typically used in today's GFCI. When a single chip is used for arc detection and ground fault protection, it can be powered from the same power supply that is used to provide power to the GFCI and, in addition other components of the GFCI such as the mechanism for interrupting the flow of current to the load when a fault occurs. This combined approach results in reduced manufacturing costs as mechanical parts of the GFCI device such as the trip relay and the mechanical contact closure mechanisms now serve dual purposes.

BRIEF DESCRIPTION OF THE DRAWINGS

Other aspects, features, and advantages of the present invention will become more fully apparent from the following detailed description, the appended claim, and the accompanying drawings in which similar elements have similar reference numerals.

FIG. 8 is a circuit diagram of the second embodiment arc detection circuit in combination with a ground fault detector.

DETAILED DESCRIPTION

Figure 1:
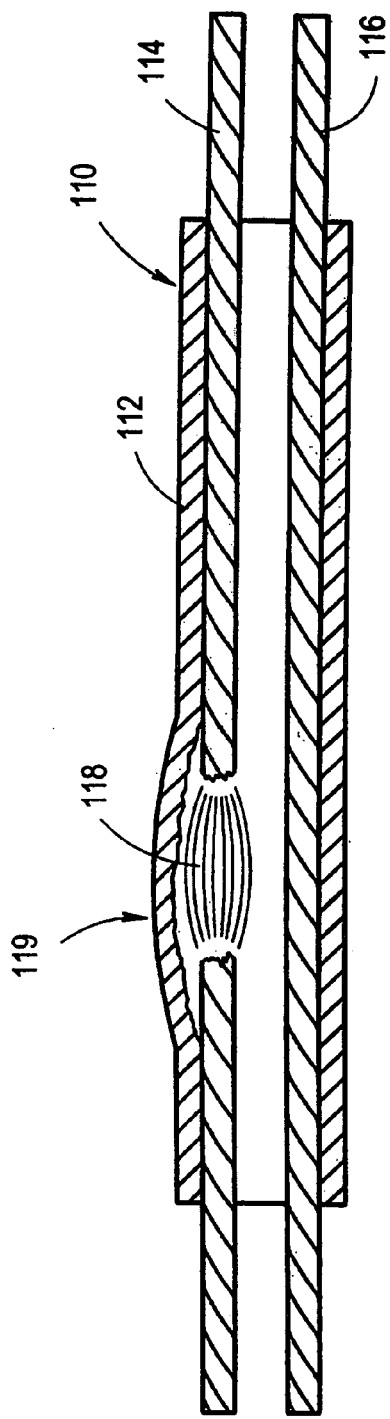
FIG. 1 illustrates an example of contact arcing in a current carrying conductor.
Figure 2:
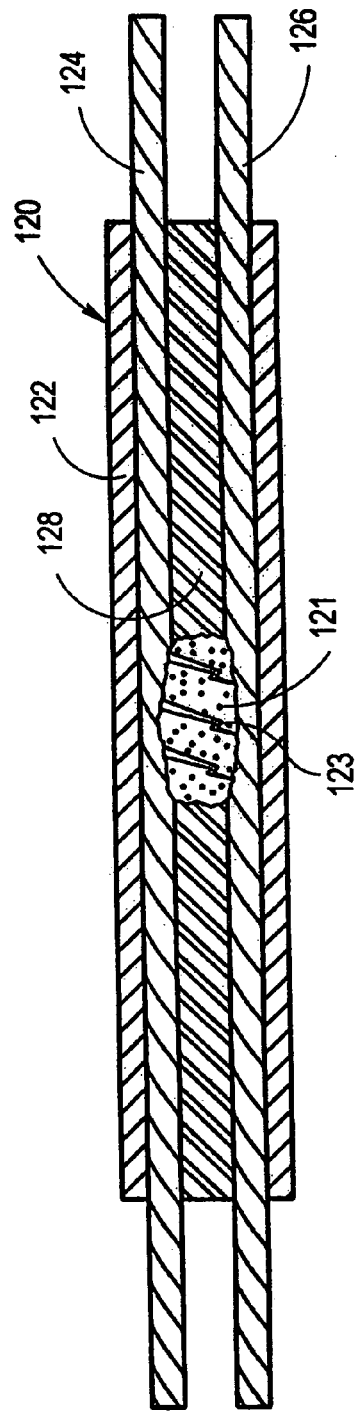
FIG. 2 illustrates an example of line arcing between two current carrying conductors.
Figure 3:
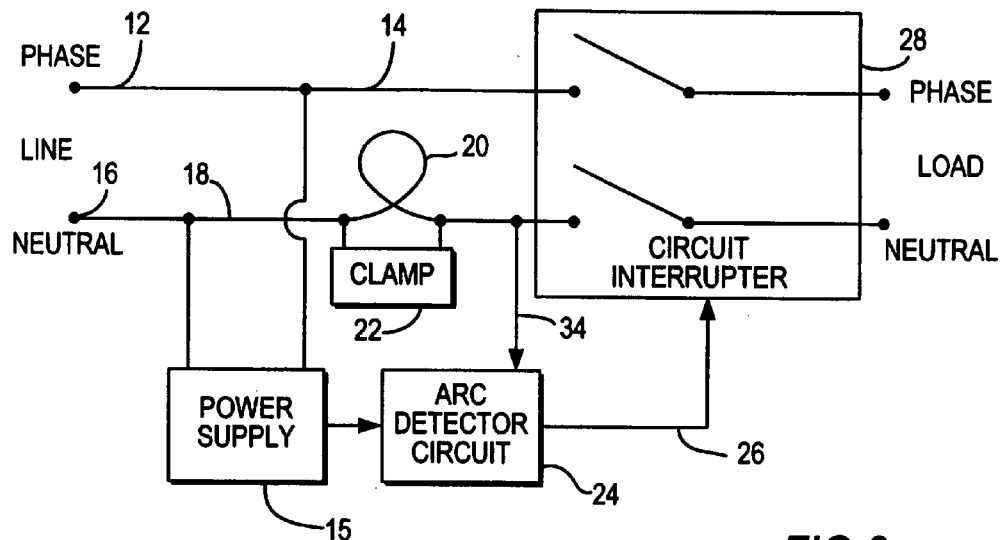
FIG. 3 is a block diagram of an arc detection system in accordance with the principles of the invention.
Figure 4:
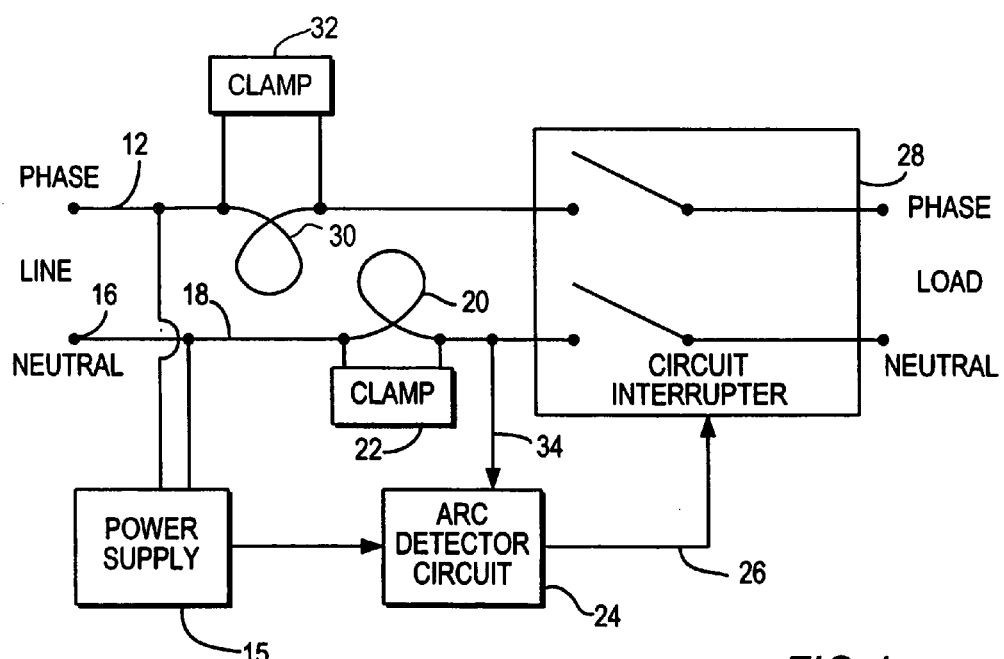
FIG. 4 is a block diagram of a second embodiment of an arc detection system in accordance with the principles of the invention.

Referring to FIG. 3, there is disclosed an arc detection circuit configured to detect arcing such as neutral-to-ground, line-to-ground, line-to-neutral and/or contact arcing. Arc detection is based upon using a series inductor to monitor the current for the occurrence of arcs in at least one of the conductors of an alternating current electrical circuit such as shown in FIGS. 3 and 4. The circuit for monitoring arcs includes a source of current (not shown) coupled to terminals 12 and 16. An inductor 20, normally of the same gauge wire as the conductor 18 is coupled in series with conductor 18. The inductance of series connected inductor 20 can be formed from a wire having as little inductance as would occur from a bend of 15 degrees, to as much inductance as would occur from 100 or more turns of 360 degrees each, and having an air or magnetic core. The inductance of series connected inductor 20 is dependent, in part, on the magnitude of the potential required to operate the arc detector circuit 24. A typical series inductor having about four complete turns each with a diameter of about 1.8 centimeters was found to provide a voltage of about 5 volts in the presence of arcing without adding any significant series impedance to the circuit. If desired, a clamp circuit 22 can be coupled in parallel with the inductor 20 to limit the maximum voltage that will appear across the inductor 20. A power supply 15 connected across the phase and neutral conductors 14, 18 upstream of the series inductor provides the low voltage power required to operate the various components of the circuit. Arc detector circuit 24 powered by power supply 15 is connected to receive the di/dt potential from series inductor 20 provided on conductor 34. More specifically, arc detector circuit 24 is coupled to receive the di/dt signal of the current in the neutral conductor 18 from inductor 20 and analyze it to determine if arcing is present. Upon determining that arcing is occurring, a trip signal is generated by an appropriate control circuit within arc detector circuit 24 and applied on conductor 26 to circuit interrupter 28. Accordingly, when arc detector circuit 24 detects the occurrence of an arc based upon the signal produced by series connected current sensing inductor 20, a trip signal is applied to circuit interrupter 28, which disconnects power to the load.

In addition, the trip signal can be fed to annunciation apparatus such as an LED, a light emitting means such as a lamp, an audio means such as a horn or siren, a graphical or alphanumeric display, etc. to indicate the occurrence of an arc.

Referring to FIG. 4, there is shown a circuit that is similar to that of FIG. 3 with the addition of a second inductor connected in series with the phase conductor and a clamp connected in parallel with the inductor to limit the maximum voltage across the inductor. An inductor 30, which may be of the same or different gauge wire as that of inductor 20, is connected in series with phase conductor 14. Series connected inductor 30 can be formed from a wire having as little inductance as would occur from a bend of 15 degrees to as much inductance as would occur from 100 or more turns of 360 degrees each, and having an air or magnetic core. When the series inductor is comprised of a conductor having a bend of 15 degrees, or a portion of a full turn, the diameter of the bend or portion of the turn can be, more or less, about three-quarters to one and a half Cm. The actual inductance that inductor 30 (and inductor 20) has is determined, mainly, by the magnitude of the output potential needed to operate the arc detector circuit 24, while, at the same time, minimizing the impedance that is added to the conductor.

Also, the inductors 20, 30 can have inductances that are of equal or different values. Thus, depending of the requirements of the circuit, the inductance of inductor 20 can be less than, equal to or greater than the inductance of inductor 30.

Arc detector circuit 24 receives the di/dt potential from series inductor 30 provided on conductor 35 and the di/dt signal of the current in the phase conductor 14 from inductor 30. Arc detector circuit 24 can analyze the di/dt signal to determine if arcing is present. In this dual-sensor embodiment, arc detector 24 generates a trip signal on conductor 26 whenever arcing is detected in either the waveform on conductor 34 or the waveform on conductor 35.

Figure 6:
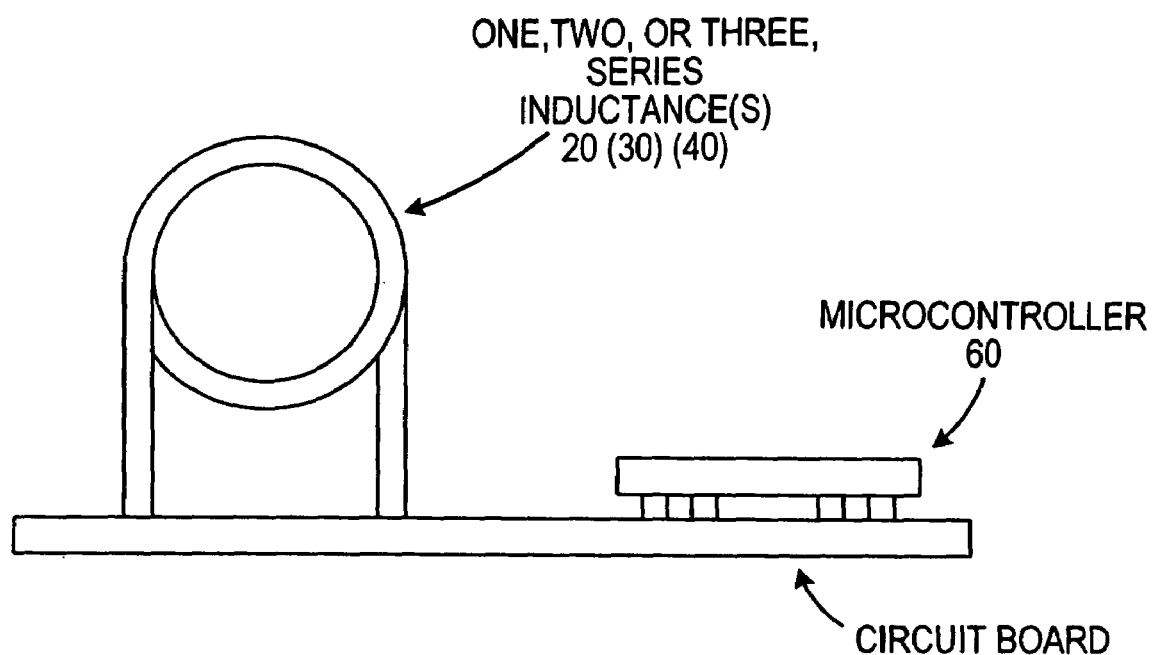
FIG. 6 is a side view of the series inductor(s) and microcontroller positioned orthogonal to each other on a circuit board.

A clamp circuit 32 can be coupled in parallel with inductor 30 to limit the maximum voltage across the inductor 30. In addition, to minimize undesired coupling effects between the inductors, the microcontroller, and the circuit board electronics, the inductors, the microcontroller, and circuit board can be positioned orthogonally, as shown in FIGS. 6 (side view) and 7 (top view).

In another embodiment of the invention the series inductor 20 of FIG. 3 is in the phase conductor 14 and ground is used as the return current path. In still another embodiment of the invention the series inductor 20 of FIG. 3 is in the phase conductor 14 and neutral is used as the return current path. In still another embodiment the series inductor is at least one winding of a transformer.

Figure 5:
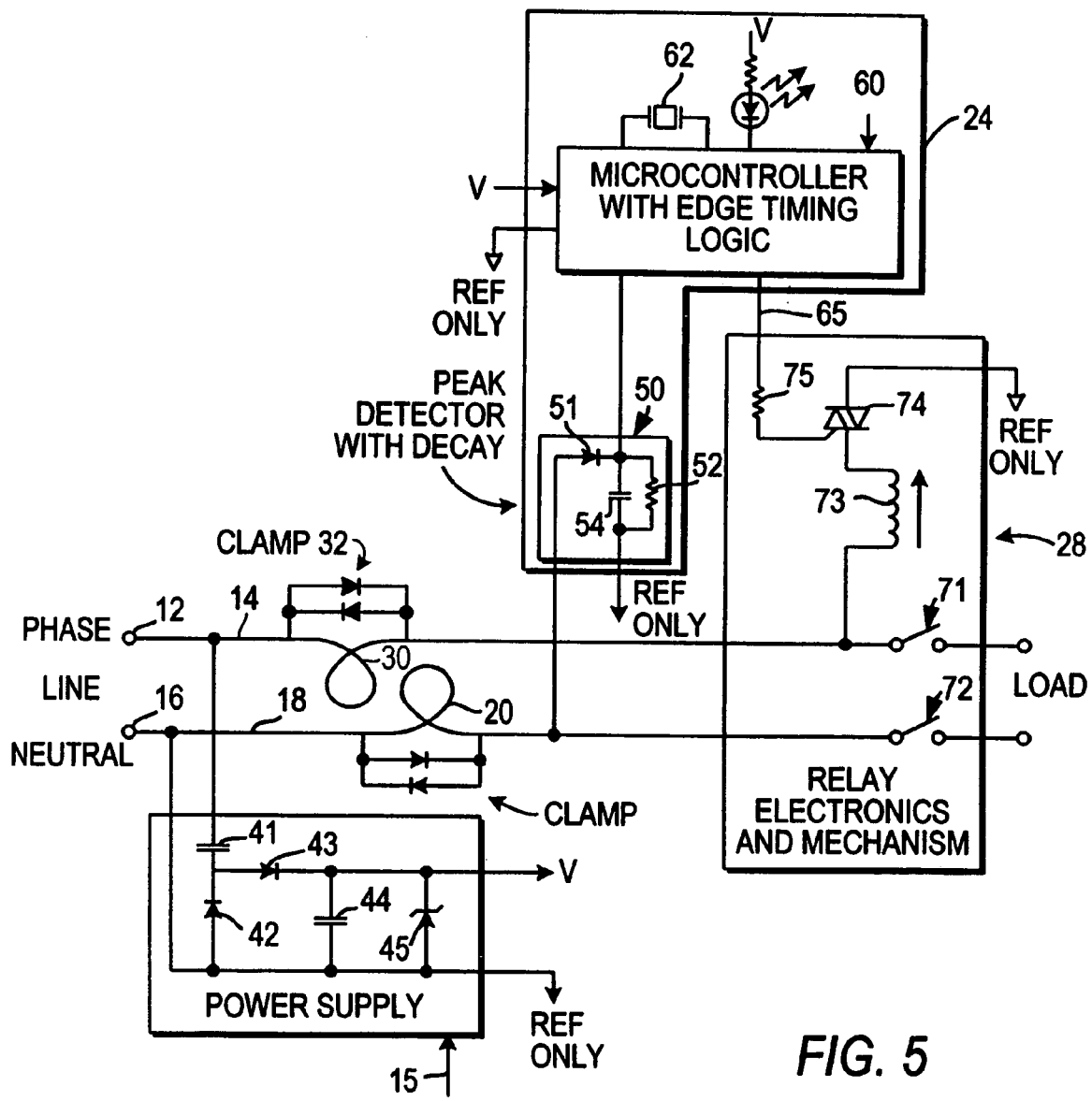
FIG. 5 is a circuit diagram of an arc detection circuit of the invention.

Referring to FIG. 5, there is shown a circuit diagram of the embodiment shown in FIG. 4. Inductor 20 is connected in series with conductor 18 and inductor 30 is connected in series with conductor 14. Power supply 15 that receives power from the phase 14 and neutral 18 conductors supplies the required potential to the arc detector circuit 24. The power supply shown has a capacitor 41 connected in series with a diode 42, and this series network is connected across the phase 14 and neutral 18 conductors upstream of the series connected inductors 20, 30. The junction of capacitor 41 and diode 42 is connected through diode 43 to an output terminal provided to supply the required potential to the arc detector circuit 24. Connected between the output terminal of the power supply and the neutral terminal is a capacitor 44 in parallel with a Zener diode 45.

The arc detector circuit 24 includes two peak detectors with decay 50, 80, two low pass filters 150, 180, and a microcontroller 60. Each peak detector includes a diode 51, 81 connected between an input terminal of the microcontroller 60 and the neutral, phase conductor 18, 14 at a point downstream of the inductor 20, 30. Conductor 34, 35 brings the neutral, phase waveform from inductor 20, 30 to peak detector 50, 80. A parallel circuit of a resistor 52, 82 and capacitor 54, 84 is connected between the cathode terminal of diode 51, 81 and the neutral terminal. The diode 51, 81 of each peak detector provides a charging path for capacitor 54, 84. Each peak detector with decay provides signals that are representative of the derivative (di/dt) of the current in conductor 18 (or conductor 14) and also serves to stretch any high speed pulses detected by the series connected inductors 20, 30.

Conductor 34, 35 also brings the waveform from the neutral, phase inductor 20, 30 to low-pass filter 150, 180. Each low pass filter includes a resistor 152, 182 connected between the conductor 34, 35 and an ADC input of the microcontroller 60, provided on conductor 155, 185. A capacitor 154, 184 is connected between the ADC input 155, 185 of the microcontroller and the neutral terminal. The resistor 152, 182 provides a charging and discharging path for capacitor 154, 184 of each low-pass filter 150, 180. Each low-pass filter provides a waveform that is representative of the low frequency current (i) in conductor 18 (or conductor 14), by resolving the voltage created across inductor 20, 30 by the DC resistance in the wire used to construct the inductor itself. Depending upon the construction of inductor 20, 30, several milliohms can be expected. The output waveform from low-pass filter 150, 180, which appears on conductor 155, 185, may be further amplified if the ADC in microcontroller 60 has inadequate resolution.

The microcontroller 60 may be of the type commercially available and includes edge-timing logic (capable of measuring the time elapsed between pulses) and analog-to-digital converter circuitry (for digitizing an analog waveform). As an engineering decision, a less expensive microcontroller may be employed, and separate edge-timing logic may be connected between the microcontroller and the peak detectors with decay 50, 80. The edge-timing logic may measure frequency, period, or pulse width. As a similar engineering decision, separate analog-to-digital conversion circuitry may be connected between the microcontroller and the low pass filters 150, 180. Microcontroller 60, with edge-timing logic and analog-to-digital conversion circuitry built-in, is available today from many manufacturers for under $1.

Microcontroller 60 produces a trip signal when a waveform that represents an arc is received from the peak detectors 50, 80, and low pass filters 150, 180. More specifically, microcontroller 60 analyzes the signals received from the peak detectors and low pass filters to determine if arcing is present and, upon finding that arcing is present, generates a trip signal that is fed to circuit interrupter 28 on conductor 26. Crystal 62 provides timing for the operation of the microcontroller.

The trip signal generated by the microcontroller is provided on conductor 26 to the gate terminal of a triac 74 in circuit interrupter 28. Circuit interrupter 28 includes a relay having two separate sets of contacts 71, 72 and a coil 73. Contacts 71 are series connected with phase conductor 14 and contacts 72 are series connected with the neutral conductor. The coil 73 of the relay is connected in series with the triac and this series network is connected between the phase conductor 14 and a neutral terminal. The gate terminal of the triac is connected through resistor 75 to conductor 26 to receive the trip signals from the microcontroller 60. A trip signal from the microcontroller primes the triac to conduct that allows current to flow through the relay coil and open the contacts 71, 72.

Referring to FIG. 8, there is shown an arc fault detector in accordance with the principles of this invention in combination with a Ground Fault Circuit Interrupter (GFCI). The circuit 182, commonly referred to as Arc Fault Circuit Interrupter/Ground Fault Circuit Interrupter (AFCI/GFCI) comprises two current transformers having magnetic cores 233, 234 and coils 235, 236, respectively, coupled to integrated circuit (IC) 225 that may comprise the LM 1851 manufactured by National Semiconductor or the RA9031 manufactured by Raytheon. AC power from one phase 14 and neutral 18 conductors is input to power supply circuit 15, which generates power for the internal circuitry of the AFCI/GFCI device.

The series circuit of relay coil 218 and SCR 224 is connected between power supply 15 and a ground terminal, and the gate terminal of the SCR is coupled to the output terminal of SCR trigger circuit 216. The output of pin 1 of IC 225 is the input to the SCR trigger circuit 216.

A diode 245 is coupled in parallel with coil 235 that is coupled to pins 2 and 3 by resistor 247 and capacitors 239, 249. Pin 3 is also coupled to neutral by capacitor 251. Coil 236 is coupled to pins 4 and 5 of IC 225 by capacitors 237, 238, and pin 4 is also coupled to ground. Pin 6 of IC 225 is coupled to pin 8 by sensitivity resistor 241 and pin 7 is coupled to ground by time delay capacitor 243. Pin 8 is also coupled to capacitor 222 and to resistor 221 and is connected to power supply 15.

Line side electrical conductors, phase conductors 14, 10 and neutral conductor 18, pass through the transformers 233, 234 to the load side phase and neutral conductors. Relay coil 218 is coupled to operate contacts 231, 232, associated with the phase and neutral conductors, respectively, which function to open the circuit in the event a fault is detected. The coil 218 of the relay is energized when the SCR 224 is turned on by a signal from the trigger circuit 216. In addition, the circuit comprises a test circuit comprised of momentary push button switch 228 connected in series with resistor 230. When switch 228 is pressed, a temporary simulated ground fault from load phase to line neutral is created to test the operation of the device.

Inductors 20, 30 are coupled in series with conductors 14, 18 and downstream of the input to the power supply 15. Conductors 34, 35 are connected to provide signals representative of the derivative (di/dt) current in conductors 14, 18 to the arc fault detector 24 as described above. The microcontroller of the arc fault detector can be a stand alone component or it can be a part of the IC 225 of the ground fault circuit interrupter. If the microcontroller is a stand alone component, the trip signal generated by the microcontroller is fed to the SCR trigger circuit 216. If the microcontroller is a part of IC 225, the trip signal is the TRIG-GFCI signal from IC 225.

In the description of the embodiments of the invention here disclosed, either one or both of the series inductors 20, 30 can be primary windings to a common secondary winding or separate secondary windings connected to feed received signals to the microcontroller. Thus, the series inductors provide the derivative (di/dt) of current flow and are the primary of at least one current transformer. An inductor of the invention here disclosed can be formed from a conductor having as little inductance as would occur from a bend of 15 degrees to as much inductance as would occur from 100 or more turns of 360 degrees each, and having an air or magnetic core. The series inductance is connected in series with all or part of the current flowing in the conductor, where the individual or combined inductances of the windings are used to obtain direct measurement of the derivative of current flowing in the conductor(s).

There is here disclosed a method and apparatus for detecting the occurrence of arcing of a conductor. Improved resolution, signal to noise ratio, derivative accuracy and high frequency response is obtained from a direct measurement of the derivative of current flow. In the invention, the inductor is connected in series with the line current to measure the derivative di/dt of the current flow. Low noise measurement is achieved by referencing the electronics to one side of the inductor, and having the electronics monitor the voltage on the other side of the inductor.

Figure 7:
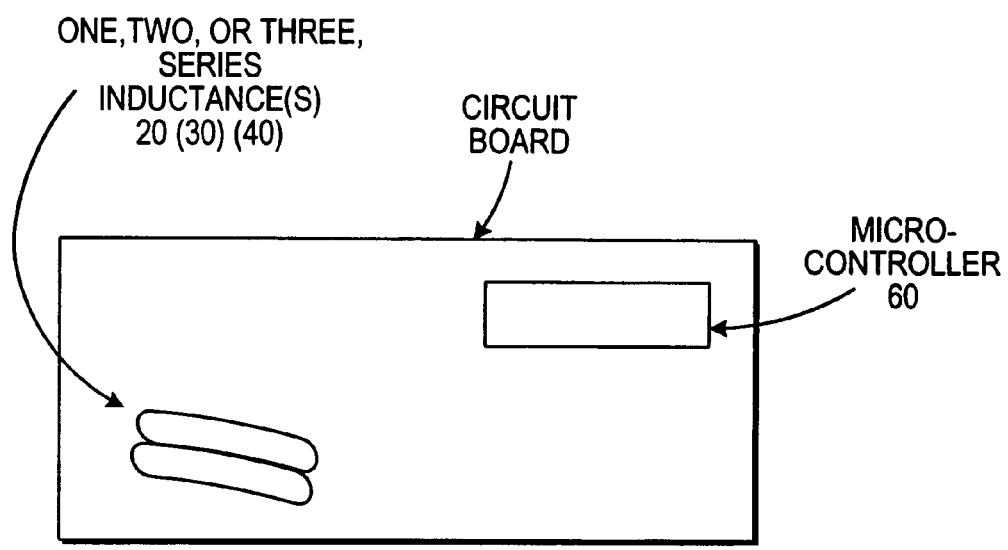
FIG. 7 is a top view of the series inductor(s) and microcontroller positioned orthogonal to each other on a circuit board.

FIGS. 6 and 7 illustrate a front and a top view, respectively, of a circuit board having a a series inductance and a microcontroller. Line current surges generate magnetic flux through the series inductor that, in turn, can induce a magnetic flux in the surrounding electronic material. Surface and sheet electric currents can also be induced in the surrounding material, in response to the magnetic flux. By orienting the inductor to be orthogonal to the printed circuit board having the electronics of the arc fault detector, the surface and sheet currents on the circuit board itself, and in the electronics mounted on or coplanar with the circuit board can be minimized.

If the derivative di/dt of the current becomes very high in magnitude, there may be an undesirable large drop of line voltage across the inductor. This can be avoided by clamping the maximum voltage drop across the inductor with one of more diodes, Zener diodes, avalanche diodes, diacs, mov's, sidacs, transorbs, gas tubes, etc.

In those instances where the electrical power distribution network is two phase, a third series inductor 40 can be coupled in series with the third conductor 10 to produce a voltage across itself related to the derivative of current flow in the third conductor. The output of inductor 40 can be coupled to arc detector 24 by conductor 36.

In devices that employ current measurements, space, which is usually at a premium in many device designs, can be saved by combining the series inductor that is sensitive to the derivative of current flow with the primary of a current measuring transformer. In this manner, the same inductor that provides direct measurement of the derivative of the current flow can also function as the primary of the current transformer.

Another way to obtain current measurements and save space and cost, is to employ the resistivity of the series inductor itself as a current sensor. In this manner, the same inductor that provides direct measurement of the derivative of the current flow can also, with minor filtering, provide direct measurement of current flow itself.

Where alternate channel sensitivity and current measurement are both required, the two inductors can act as the primaries of a current transformer. In this embodiment, the flux induced in the transformer core from each of the two inductors should be either additive or subtractive but, when subtractive, they should not fully cancel each other.

Where alternate channel sensitivity and ground fault detection are both required, the two inductors can together act as the primaries on a ground fault differential transformer. In this embodiment, the coupling provided by the transformer may or may not be the only coupling between the two inductors and the flux induced in the transformer core for a given current, from each of the inductors, must either fully or nearly fully cancel each other.

Where alternate channel sensitivity and ground fault detection are both required, the two inductors can together act as the primaries of a ground fault transformer. In this embodiment, the coupling provided by the transformer may or may not be the only coupling between the two inductors. Therefore, the flux induced in the transformer core for a given current, from each of the inductors, should be additive or subtractive.

The arc detector here disclosed can be combined with other types of circuit interrupting devices such as a ground fault circuit interrupter (GFCI), immersion detection circuit interrupter (IDCI) or appliance leakage current interrupter (ALCI). In the case of a GFCI, the arc detection circuitry can be placed onboard the same silicon chip typically used in today's GFCI devices. In some instances, some of the pins of commonly used GFCI integrated circuits can be converted for multifunction operation. The AFCI can be powered from the same power supply that provides power to the circuit interrupting device. This combined approach can result in reduced manufacturing costs as the mechanical parts of the circuit interrupting device such as the trip relay and the mechanical contact closure mechanisms will serve dual purposes. In an implementation, a GFCI may be combined with AFCI circuitry because a GFCI can detect arcing in certain situations including any condition whereby an arc produces leakage current to ground.

The arc fault detector can include a reset lock-out mechanism. Reset lock-out mechanisms are well-known in the art. The reset lock-out mechanism can prevent the resetting of electrical connections between the line and the load conductors if the arc fault detector is non-operational or if an open neutral condition exists. An example of a reset lock-out mechanism is disclosed in U.S. Pat. No. 6,040,967.

In an implementation, the reset lock mechanism can operate independently of the arc fault detector that breaks the connection between the line and the load conductors. The circuit interrupting devices that include a trip portion that can break electrical conductive paths between the line and the load conductors independently of the operation of a circuit interrupting portion used to sense faults and break the conductive paths when a fault is sensed, and a reset lock-out portion capable of preventing the device from resetting if the circuit interrupting portion is not functioning properly or if an open neutral condition exists. An example of a reset lock-out mechanism with independent trip is disclosed in U.S. Pat. No. 6,282,070.

In another implementation, the arc fault detector can be combined with the added safety provided by a reverse wiring protection system. The reverse wiring protection operates at both the line and load sides of the device so that in the event line side wiring to the device is improperly connected to the load side, arc fault protection for the device remains operative. The arc fault detector trip portion operates independently of a circuit interrupting portion used to break the electrical continuity in one or more conductive paths in the device. A reset lockout portion also can be included to prevent the reestablishing of electrical continuity in open conductive paths if the circuit interrupting portion is non-operational or if an open neutral condition exists. An example of a reverse wiring protection system is disclosed in U.S. Pat. No. 6,246,558.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures do not depart from the spirit and scope of the invention in its broadest form.

What is claimed is:

1. Apparatus for detecting arcs on an electrical power distribution network having at least one conductor comprising:
    series inductance means adapted to be coupled in series with a conductor of the network wherein a voltage is produced across the series inductance means having a single waveform that relates to the derivative of current flow in the conductor;
    arc detection means coupled to identify when the single waveform of the voltage across the series inductance means is representative of arcing on the network and to generate an arc detection signal from the single waveform when the single waveform is representative of arcing on the network; and
    current measuring means coupled to the series inductance means to measure the current flowing in the at least one conductor from the single waveform of the voltage across the series inductance means.

2. The apparatus of claim 1 wherein the at least one conductor comprises a neutral conductor and a phase conductor.

3. The apparatus of claim 1 wherein the series inductance means comprises a conductor having between one and 100 turns.

4. The apparatus of claim 1 comprising a ground fault circuit interrupter.

5. The apparatus of claim 1 comprising an immersion detection circuit interrupter.

6. The apparatus of claim 1 comprising an appliance leakage current interrupter.

7. The apparatus of claim 1 comprising reset lock-out mechanism.

8. The apparatus of claim 7 wherein the reset lock-out mechanism operates independently of the arc detection means.

9. The apparatus of claim 1 comprising reverse wiring protection system.

10. Apparatus for detecting arcs on an electrical power distribution network having at least two conductors comprising:
    a first series inductance means adapted to be coupled to a first of the at least two conductors to produce a voltage across itself related to the derivative of current flow in the first conductor;
    a second series inductance means adapted to be coupled to a second of the at least two conductors to produce a voltage across itself related to the derivative of current flow in the second conductor;
    an arc detection means responsive to the waveforms of the voltages across all of the series inductance means to determine when a waveform indicative of arcing on the network is present and to generate an arc detection signal when arcing is present; and Current measuring means coupled to the first and/or second series inductance means to measure the current flowing in the first and/or second conductors from the single waveform of the voltage across the first and/or second series inductance means.

11. The apparatus of claim 10 further comprising:

a third series inductance means coupled in series with a third conductor of the network to produce a voltage across itself related to the derivative of current flow in the third conductor.

12. The apparatus of claim 10 comprising a ground fault circuit interrupter.

13. The apparatus of claim 10 comprising an immersion detection circuit interrupter.

14. The apparatus of claim 10 comprising an appliance leakage current interrupter.

15. The apparatus of claim 10 comprising reset lock-out mechanism.

16. The apparatus of claim 15 wherein the reset lock-out mechanism operates independently of the arc detection means.

17. The apparatus of claim 10 comprising reverse wiring protection system.

* * * * *